(12) United States Patent
Chiu

(10) Patent No.: US 6,869,825 B2
(45) Date of Patent: Mar. 22, 2005

(54) FOLDED BGA PACKAGE DESIGN WITH SHORTENED COMMUNICATION PATHS AND MORE ELECTRICAL ROUTING FLEXIBILITY

(75) Inventor: Chia-Pin Chiu, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 118 days.

(21) Appl. No.: 10/334,650

(22) Filed: Dec. 31, 2002

(65) Prior Publication Data

US 2004/0124527 A1 Jul. 1, 2004

(51) Int. Cl.[7] ............................................. H01L 21/44
(52) U.S. Cl. .................... 438/106; 438/107; 257/686; 257/723; 365/52
(58) Field of Search .............................. 438/106, 107, 438/109, 108, 112, 117, 118, 119, 125, 127; 257/686, 723, 724, 725, 678, 702, 713; 365/52; 174/52.2

(56) References Cited

U.S. PATENT DOCUMENTS

| | | | |
|---|---|---|---|
| 5,448,511 A | * | 9/1995 | Paurus et al. .................. 365/52 |
| 5,646,446 A | * | 7/1997 | Nicewarner et al. ........ 257/723 |
| 5,776,797 A | * | 7/1998 | Nicewarner et al. ........ 438/107 |
| 6,121,676 A | * | 9/2000 | Solberg ....................... 257/686 |
| 6,225,688 B1 | * | 5/2001 | Kim et al. ................... 257/686 |
| 6,376,769 B1 | * | 4/2002 | Chung ......................... 174/52.2 |

* cited by examiner

Primary Examiner—Matthew Smith
Assistant Examiner—Belur V Keshavan
(74) Attorney, Agent, or Firm—Schwegman, Lundberg, Woessner & Kluth, P.A.

(57) ABSTRACT

A method and apparatus for making a multiply folded BGA package design with shortened communication paths and more electrical routing flexibility. A package apparatus includes a substrate and a first integrated circuit (IC), wherein the first IC is electrically connected to the first face of the substrate, and wherein a first segment and a second segment of the substrate are both folded around the first IC. A second IC is electrically connected to the second face of the substrate, such that the second IC is connected to the first and second folded segments of the substrate abode the first IC.

20 Claims, 3 Drawing Sheets

FOLDED BGA PACKAGE DESIGN WITH SHORTENED COMMUNICATION PATHS AND MORE ELECTRICAL ROUTING FLEXIBILITY

FIELD OF THE INVENTION

This invention relates to the field of electronic package fabrication, and more specifically to a method and apparatus of making a BGA package having a folded circuit device.

BACKGROUND OF THE INVENTION

Bare electronic chips typically need to be packaged in a package that provides an electric circuit to each electrical connection of the chip and to an external connector such as a pin or a ball. Typical is a pin-grid array package having relatively large pins on one side for external connections, and pads on an opposite side for connections to a ball-grid-array set of connections to the electronic chip (such as a processor or memory chip). Also typical is a ball-grid array package having relatively large balls with relatively large spacings on one side of the package for external connections, and small closely spaced pads on the same side for connections to a ball-grid-array set of connections to the electronic chip (such as a processor or memory chip).

Such a package typically has a non-conductive substrate (such as a plastic film or layer) with conductive traces (wires) on or in a surface of the substrate. Some packages include multiple chips, such as a logic or processor chip, as well as a memory chip, such as a FLASH-type reprogrammable non-volatile memory. Balls and/or pins are attached to the outside of the package, and one or more electronic chips are attached, for example, by also using ball-grid-array connection methods and/or flying-wire methods. Optionally, a cover or encapsulant is used to enclose the chip or chips.

One conventional way to make such a package is to start with a sheet or strip of non-conductive material such as Mylar film, then deposit a film of metal such as copper, then pattern and etch the metal to leave traces. The chips are then connected to the traces on the Mylar film and encapsulated to form the package. With one chip at one end of the film, and another chip at an opposite end, the traces to connect the signals at the far ends of the chips can be longer than desired.

What is needed is a simple, inexpensive, reliable method and apparatus to fabricate packages for electronic chips, so that the package is compact and the traces are relatively short.

DESCRIPTION OF PREFERRED EMBODIMENTS

Figure 1:
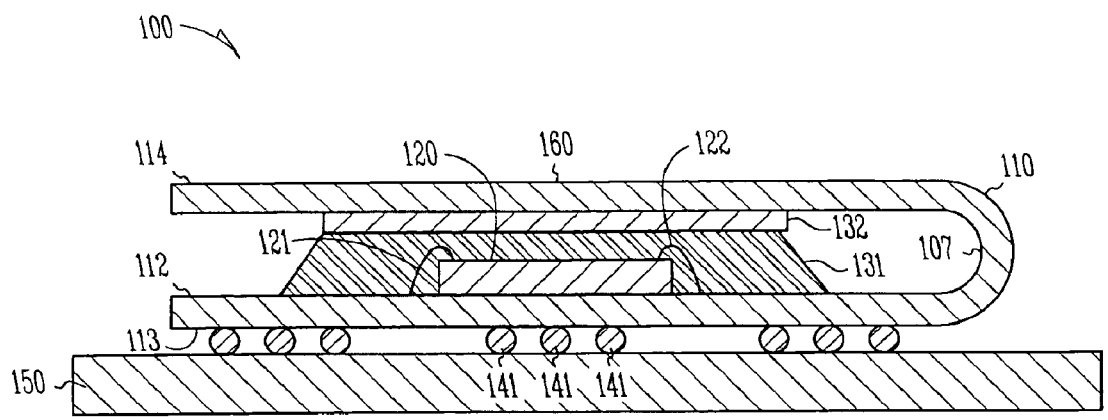
FIG. 1 is side cross-section view of a folded flexible substrate 110 having a single fold 107.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

TERMINOLOGY

The terms chip, die, integrated circuit, monolithic device, semiconductor device, and microelectronic device, are used interchangeably in this description.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally copper (Cu) or an alloy of Cu and another metal such as nickel (Ni), aluminum (Al), titanium (Ti), molybdenum (Mo), or stacked layers of different metals, alloys or other combinations, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

In this description, the term metal applies both to substantially pure single metallic elements and to alloys or combinations of two or more elements at least one of which is a metallic element.

Substrate generally refers to the physical object that is the basic workpiece that is transformed by various process operations into the desired microelectronic configuration. Substrates may include conducting material (such as copper or aluminum), insulating material (such as sapphire, ceramic, or plastic), semiconducting materials (such as silicon), non-semiconducting, or combinations of semiconducting and non-semiconducting materials. In some embodiments, substrates include layered structures, such as a sheet of material chosen for electrical and/or thermal conductivity (such as copper) covered with a layer of plastic chosen for electrical insulation, stability, and embossing characteristics.

The term vertical is defined to mean substantially perpendicular to the major surface of a substrate. Height or depth refer to a distance in a direction perpendicular to the major surface of a substrate.

FIG. 1 is side cross-section view of package 100 having a folded flexible substrate 110 with a single fold 107. Substrate 110 is typically a plastic film such as Mylar having a plurality of traces of metal, such as copper. In some embodiments, a base section 112 of the substrate will be attached to a printed circuit board (PCB) 150 using solder balls 141 arranged in a ball-grid array on the outer bottom surface 113. In some embodiments, an integrated circuit chip 120 (such as a logic circuit or a processor, for example) is attached to the inner bottom surface using a plurality of flying leads 121, 122 as shown. In other embodiments, a ball-grid array connection of suitably sized solder balls connects chip 120 to substrate 110 (see FIG. 5B). In some embodiments, an encapsulant 131 encloses chip 120. Flexible substrate 110 is folded at fold 107 and section 114 of the substrate 110 is attached (for example, using an epoxy adhesive 132) to the top surface of encapsulant 131. This provides a plurality of connection pads on top surface 160.

Figure 2:
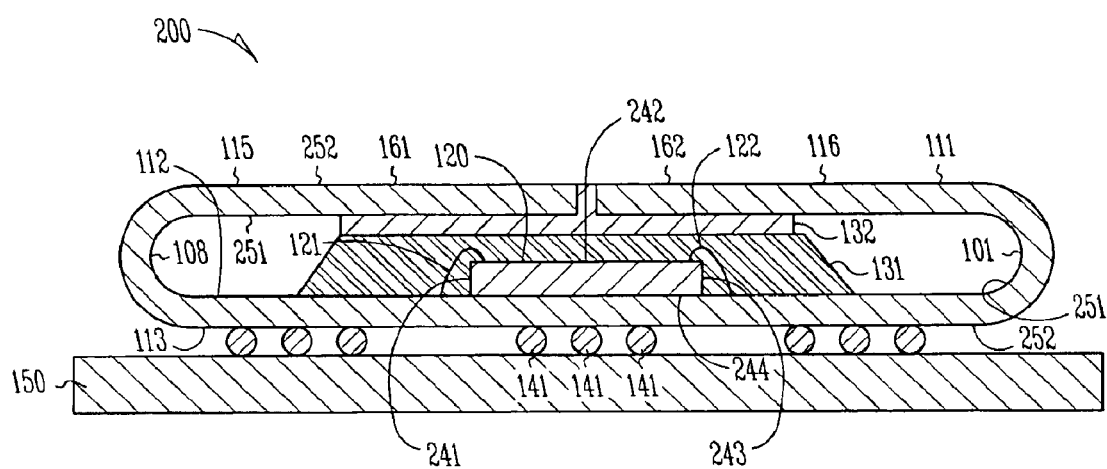
FIG. 2 is side cross-section view of a folded flexible substrate 111 having a plurality of folds 108, 109.

FIG. 2 is side cross-section view of package 200 having a folded flexible substrate 111 having a plurality of folds 108, 109. Package 200 is substantially similar to package 100, except that a plurality of folds provides shorter signal paths between the inner chip(s) and the outer chip(s). Like substrate 110, substrate 111 is typically a plastic film such as Mylar having a plurality of traces of metal, such as copper. In some embodiments, a base section 112 of the substrate will be attached to a printed circuit board (PCB) 150 using solder balls 141 arranged in a ball-grid array on the outer bottom surface 113 of substrate 111. In some embodiments, an integrated circuit chip 120 (such as a logic circuit or a processor, for example) is attached to the inner bottom surface using a plurality of flying leads 121, 122 as shown. In other embodiments, a ball-grid array connection of suitably sized solder balls connects chip 120 to substrate 111 (see FIG. 5B). In some embodiments, an encapsulant 131 encloses chip 120. Flexible substrate 111 is folded at fold 108 and at fold 109, and sections 115 and 116 of the substrate 111 are attached (for example, using an epoxy adhesive 132) to the top surface of encapsulant 131. This provides a plurality of solder-connection pads on top surfaces 161 and 162.

The inner integrated circuit (IC) 120 is attached to substrate 111 such that its first face 244 is facing the inner (first) face 251 of substrate 111, and the electrical connections 121, 122 are made to the inner face 251 of substrate 111. The second IC 163 (see FIG. 4) is attached to the second face 252 of substrate 111, such that the first face 461 of the second IC 163 is facing the second face 242 of the first IC 120. The second face 462 (see FIG. 4) faces outward. In some embodiments, the first folded-back segment 115 covers (is adjacent to) a first portion (for example, about half in some embodiments) of the second face 242 (top in the figure) of the first IC 120, and provides solder pads 161. The second folded-back segment 116 covers (is adjacent to) a second portion (for example, about the other half in some embodiments) of the second face 242 (top) of the first IC 120, and provides a top surface 162. Fold 108 is made on the first segment 115 that extends from the first side 241 of IC 120. Fold 109 is made on the second segment 116 that extends from the second side 243 of IC 120. In some embodiments, the first side 241 is opposite and parallel to the second side 243. In other embodiments, the first side 241 is adjacent and perpendicular to the second side 243 (e.g., see segments 511 and 512 of FIG. 5A).

Figure 3:
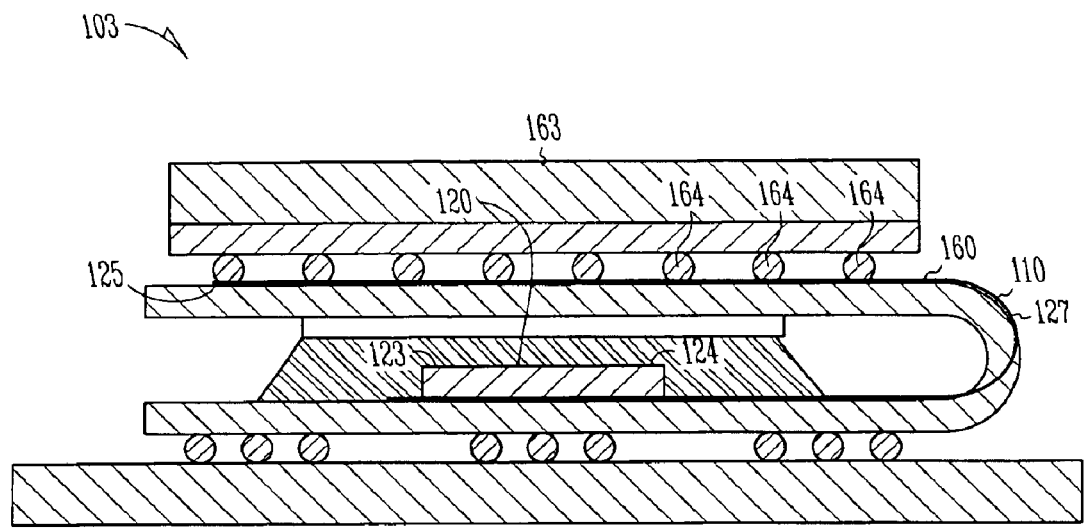
FIG. 3 is side cross-section view of folded flexible substrate 110 having a long communication path 127.

FIG. 3 is side cross-section view of completed package 103 having a folded flexible substrate 110 with a long communication path 127. Package 103 is the same as package 100, except that an outer module 163 has been attached using solder balls 164. The outer integrated circuit/module 163 (any desired IC or module such as one or more FLASH memory chips, for example) is attached with solder balls 164 to top surface 160 using ball-grid array connection techniques. Note the relatively long communications path 127, which connects the far pad 123 of the inner chip 120 to the far pad 125 of the outer chip. (The trace from near pad 124 of inner chip 120 has a shorter path to outer chip 163, as shown in FIG. 4.)

Figure 4:
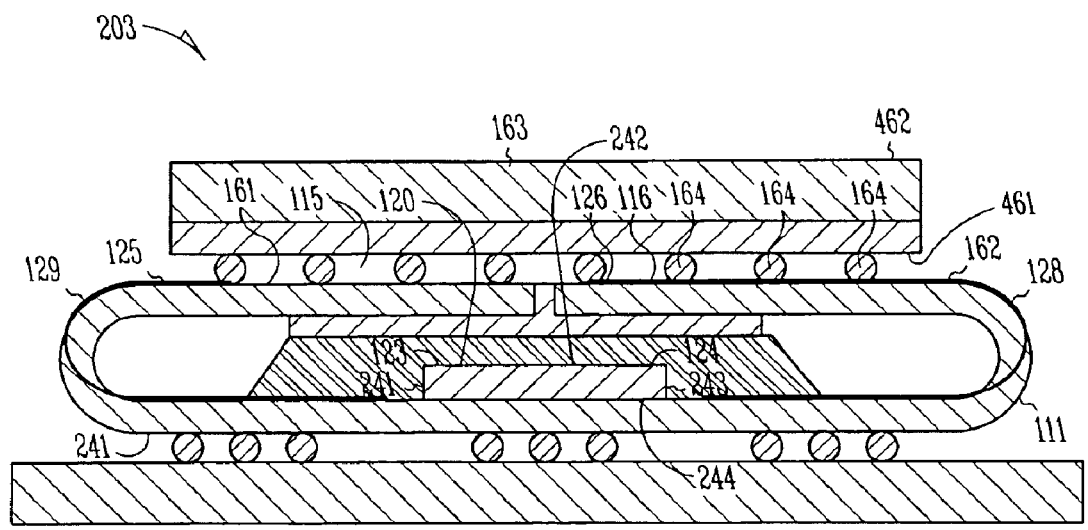
FIG. 4 is side cross-section view of folded flexible substrate 111 having a plurality of shorter communication paths 128, 129.

FIG. 4 is side cross-section view of completed package 203 having a folded flexible substrate 111 with a plurality of shorter communication paths 128, 129. Package 203 is the same as package 200, except that an outer chip 163 has been attached. The outer integrated circuit module 163 (such as a FLASH memory chip, for example) is attached with solder balls 164 to solder pads on top surfaces 161 and 162 using ball-grid array connection techniques. Note the relatively shorter communications path 129 (as compared to path 127 of FIG. 3), which connects the far pad 123 of the inner chip 120 to the far pad 125 of the outer module 163 using first segment 115. Communications path 128, which connects the far right-hand pad 124 of the inner chip 120 to the far innermost pad 126 (the left-most of the pads on the right side of the outer module 163) using a trace on the right-hand second segment 116, remains the same length. This path 128 becomes the longest path on package 203, but is shorter than the longest path 127 of package 103 of FIG. 3.

Figure 5A:
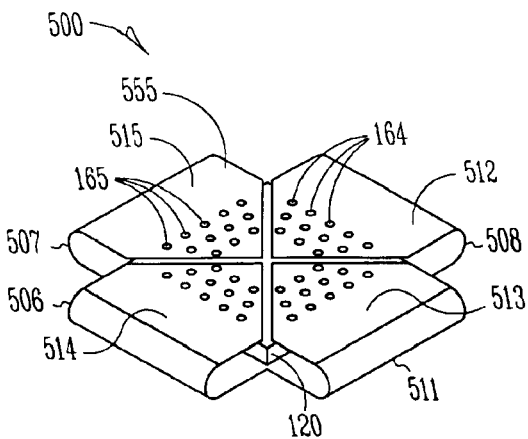
FIG. 5A is a perspective view of package 500 with a folded flexible substrate 511 having a plurality of folds 506, 507, 508, 509.

FIG. 5A is a perspective view of a package 500 using a folded flexible substrate 511 having a plurality of folds (in this embodiment, four folds 506, 507, 508, and 509). In this embodiment, four folds are used, and four flaps or segments 512, 513, 514, and 515 each provide one or more connection pads 165 on the upper surface of package 500. As shown in FIG. 2, an inner chip (or module) 120 is connected to the inner floor of substrate 511 and covered with an encapsulant 131 and adhesive 132. In some embodiments, the encapsulant 131 is omitted, and the adhesive 132 directly connects to the top surface of chip or module 120. In some embodiments, a paste adhesive is used so the folded segments 512–515 can be contacted to the adhesive, and then moved laterally in order to achieve the proper alignment and spacing of the solder balls 164 on the various segments, and held until the adhesive sets. In some embodiments, fiducial holes or other fiducial features 555 (shown as x's) are provided on each segment 512–515 in order to help align and space the segments relative to one another, such that the upper pads 165 properly align to solder balls 164 connected to chip or module 163 (see FIG. 4). In other embodiments, flying lead attachments are made from pads on the outer face of chip 163 to pads on the upper faces of segments 512–515. Substrate 511 is identical to substrate 111, except that substrate 511 wraps around inner chip 120 on all four sides, while substrate 111 wraps around inner IC 120 on two sides. In other embodiments, substrate 111 wraps around in three sides of inner IC 120, or in other topologies having a plurality of folds.

Figure 5B:
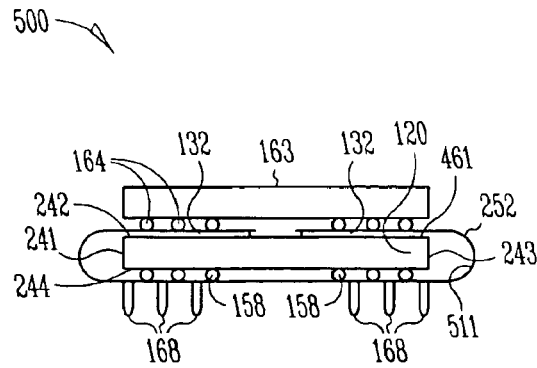
FIG. 5B is a cross-section side of package 500.

FIG. 5B is a cross-section side of one embodiment of package 500. In this embodiment, a plurality of pins 168 is provided on the bottom of package 500 for attachment to, for example, a PCB 150 or a zero-insertion-force (ZIF) socket. In other embodiments, solder balls 141 (such as shown in FIG. 2) are used in place of pins 168. In the embodiment shown, a plurality of solder balls 158 connect chip 120 to the first major face (the inner face) of substrate 511, and a plurality of solder balls 164 connect chip 163 to the second major face (the outer face) of substrate 511. In the embodiment shown, adhesive 132 directly connects the upper segments of substrate 511 to the upper face 242 of inner chip 120. Other aspects are as described for FIG. 4 and FIG. 2.

Figure 6:
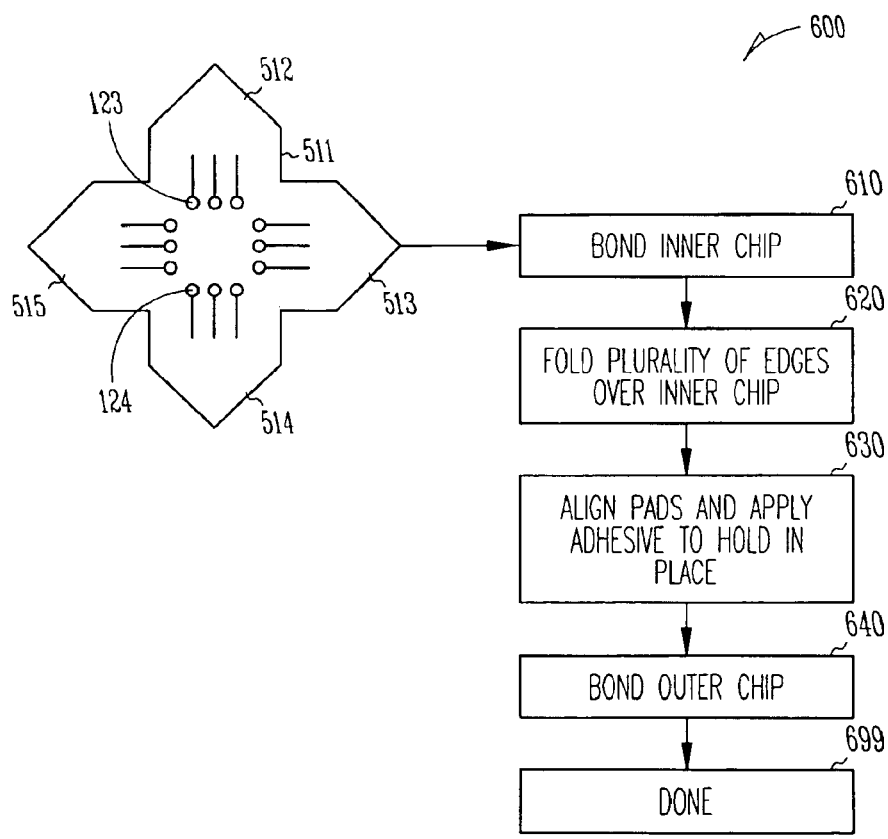
FIG. 6 is a flow chart showing fabrication method 600.

FIG. 6 is a flow chart showing fabrication method 600 for making a package 500. A starting substrate 511 is provided (a top view in the substrate 511 is shown before the method is performed), having inner contact pads 123, 124, and four lateral segments 512, 513, 514, and 515. At block 610, the inner chip or module 120 is attached to the inner contact pads 123, 124. In various embodiments, any suitable inner chip or plurality of chips are used, such as a processor chip, logic array, chipset, memory, etc. At block 620, each one of a plurality of the edge segments is folded back over the inner chip 120. At block 630, the solder balls 164 of the plurality of segments 512–515 are aligned and spaced to one another and held in place until the applied adhesive 132 sets. In various embodiments, any suitable adhesive is used, such as epoxy, contact cement, encapsulant, etc. At block 640, the outer chip 163 is bonded to the solder balls 164. In various embodiments, any suitable outer chip or plurality of chips are used, such as a processor chip, logic array, chip set, memory (such as SDRAM (synchronous dynamic random-access memory) and/or read-only memory such as FLASH EEPROMs (electrically erasable programmable read-only memories)), etc. In some embodiments, an outer encapsulant (not shown) is used to enclose the package 500. At block 699, the processing is done. In some embodiments, the finished package is attached to a PCB 150, such as shown in FIG. 2.

Conclusion

Some embodiments of the invention include an apparatus 200 or 500 that includes a substrate 111 or 511 having a first face and an opposite second face, and a first integrated circuit (IC) 120 having a first face 244 and a second face 242 opposite the first face 244, wherein the first IC 120 is electrically connected to the first face 251 of the substrate with the first face 244 of the first IC 120 facing the first face 251 of the substrate 111 or 511, and wherein a first segment 113 of the substrate along a first side 241 of the first IC 120 is folded over the first IC 120 to be adjacent to and parallel to the second face 242 of the first IC 120, and a second segment 114 of the substrate along a second side 243 of the first IC 120 is folded over the first IC to be adjacent to and parallel to the second face 242 of the first IC 120.

In some embodiments, the substrate 120 includes plurality of conductive traces including a first trace (or communications path) 128 and a second trace (or communications path) 129, the first trace 128 connecting a first pad 124 on the first face 251 of the substrate 111 to a first pad 126 on a second face 252 of the substrate 111, the second trace 129 connecting a second pad 123 on the first face 251 of the substrate 111 to a second pad 125 on the second face 252 of the substrate 111, and wherein the first (IC) 120 is electrically connected to the first pad 124 and to the second pad 123 on the first face 251 of the substrate, and the first IC circuit is secured to the first major face 251 of the substrate, and wherein the first trace 128 extends along the first segment 116 and the second trace 129 extends along the second segment 115.

In some embodiments, the apparatus 200 or 500 further includes a second IC 163 having a first face 461 and a second face 462 opposite the first face 461, wherein the second IC 163 is electrically connected to the second face 252 of the substrate 111 or 511 adjacent the second face 242 of the first IC 120, and has at least one electrical connection 126 to the first trace 128 on the first segment and at least one electrical connection on the second trace on the second segment.

In some embodiments, the second IC 163 is electrically connected to the top surface 161 and 162 of the substrate using solder balls 164.

In some embodiments, the first IC 120 is electrically connected to the first face 251 of the substrate using flying leads 121, 122.

In some embodiments, the first IC 120 is electrically connected to the first face 251 of the substrate using solder balls 158.

In some embodiments, the first segment 115 of the substrate extends from the first side 241 of the first IC 120 and is folded over the first IC to be adjacent a first portion of the second face 242 of the first IC 120, and the second segment 116 of the substrate extends from the second side 243 of the first IC 120 opposite the first side of the first IC 120 and is folded over the first IC 120 to be adjacent a second portion of the second face 242 of the first IC 120.

In some embodiments, the first side 461 of the second IC 163 is facing the second side 242 of the first IC 120.

Some embodiments further include a second IC 163, wherein the second IC 163 is electrically connected to the second face 252 of the substrate, and has at least one electrical connection 125 to the first trace 129 on the first segment 115 and at least one electrical connection 126 on the second trace 128 on the second segment 116.

Some embodiments further include an encapsulant 131 covering the first IC 120, wherein the first segment 115 is adhesively connected to the encapsulant 131 over a portion of the second face 242 of the first IC 120 and the second segment 116 is adhesively connected to the encapsulant 131 over another portion of the second face 242 of the first IC 120.

Some embodiments of the invention include a method for making an electronics package. The method includes providing a substrate having plurality of conductive traces including a first trace and a second trace, the first trace connecting to a first pad on a first face of the substrate, the second trace connecting to a second pad on the first face of the substrate, attaching a first face of a first integrated circuit to the first face of the substrate and electrically connecting the first integrated circuit to the first pad and the second pad, folding a first segment of the substrate over the first integrated circuit to be adjacent a second face of the integrated circuit opposite the first face, and folding a second segment of the substrate over the first integrated circuit to be adjacent the second face of the integrated circuit.

In some embodiments of the method, the first trace connects to a first pad on the second face of the substrate, and the second trace connects to a second pad on the second face of the substrate, and the method further includes attaching a first face of a second integrated circuit to the second face of the substrate adjacent the second face of the first integrated circuit and electrically connecting the second integrated circuit to the first pad and the second pad on the second face of the substrate.

Some embodiments of the method further include covering the first IC with an encapsulant, adhesively connecting the first segment to the encapsulant over a portion of the second face of the first IC, and adhesively connecting the second segment to the encapsulant over another portion of the second face of the first IC.

In some embodiments, the first trace connects to a first pad on the second face of the substrate, and the second trace connects to a second pad on the second face of the substrate, and the method further includes covering the first IC with an encapsulant, adhesively connecting the first segment to the encapsulant over a portion of the second face of the first IC, adhesively connecting the second segment to the encapsulant over another portion of the second face of the first IC, and attaching a first face of a second integrated circuit to the second face of the substrate adjacent the second face of the first integrated circuit and electrically connecting the second integrated circuit to the first pad and the second pad on the second face of the substrate. In some such embodiments, the electrically connecting the second integrated circuit to the first pad and the second pad on the second face of the substrate includes using solder ball connections.

In some embodiments, the first trace connects to a first pad on the second face of the substrate, and the second trace connects to a second pad on the second face of the substrate, and the method further includes adhesively connecting the first segment to a portion of the second face of the first IC, adhesively connecting the second segment to another portion of the second face of the first IC, and attaching a first face of a second integrated circuit to the second face of the substrate adjacent the second face of the first integrated circuit and electrically connecting the second integrated circuit to the first pad and the second pad on the second face of the substrate.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An apparatus comprising:
    a substrate having a first face and an opposite second face; and
    a first integrated circuit (IC) having a first face and a second face opposite the first face, wherein the first IC is electrically connected to the first face of the substrate with the first face of the first IC facing the first face of the substrate, and wherein a first segment of the substrate along a first side of the first IC is folded over the first IC to be adjacent the second face of the first IC, and a second segment of the substrate along a second side of the first IC is folded over the first IC to be adjacent the second face of the first IC.

2. The apparatus of claim 1, wherein the substrate includes plurality of conductive traces including a first trace and a second trace, the first trace connecting a first pad on the first face of the substrate to a first pad on a second face of the substrate, the second trace connecting a second pad on the first face of the substrate to a second pad on the second face of the substrate; and wherein the first (IC) is electrically connected to the first pad and to the second pad on the first face of the substrate, and the first IC circuit is secured to the first major face of the substrate, and wherein the first trace extends along the first segment and the second trace extends along the second segment.

3. The apparatus of claim 2, further comprising:
    a second IC having a first face and a second face opposite the first face, wherein the second IC is electrically connected to the second face of the substrate adjacent the second face of the first IC, and has at least one electrical connection to the first trace on the first segment and at least one electrical connection on the second trace on the second segment.

4. The apparatus of claim 3, wherein the second IC is electrically connected to the second face of the substrate using solder balls.

5. The apparatus of claim 4, wherein the first IC is electrically connected to the first face of the substrate using flying leads.

6. The apparatus of claim 4, wherein the first IC is electrically connected to the first face of the substrate using solder balls.

7. The apparatus of claim 3, wherein the first side of the second IC is facing the second side of the first IC.

8. The apparatus of claim 7, further comprising:
    a second IC, wherein the second IC is electrically connected to the second face of the substrate, and has at least one electrical connection to the first trace on the first segment and at least one electrical connection on the second trace on the second segment.

9. The apparatus of claim 7, further comprising:
    an encapsulant covering the first IC, wherein the first segment is adhesively connected to the encapsulant over a portion of the second face of the first IC and the second segment is adhesively connected to the encapsulant over another portion of the second face of the first IC.

10. The apparatus of claim 1, wherein the first segment of the substrate extends from the first side of the first IC and is folded over the first IC to be adjacent a first portion of the second face of the first IC, and the second segment of the substrate extends from the second side of the first IC opposite the first side of the first IC and is folded over the first IC to be adjacent a second portion of the second face of the first IC.

11. A method for making an electronics package, the method comprising:
    providing a substrate having plurality of conductive traces including a first trace and a second trace, the first trace connecting to a first pad on a first face of the substrate, the second trace connecting to a second pad on the first face of the substrate;
    attaching a first face of a first integrated circuit to the first face of the substrate and electrically connecting the first integrated circuit to the first pad and the second pad;
    folding a first segment of the substrate over the first integrated circuit to be adjacent a second face of the integrated circuit opposite the first face; and
    folding a second segment of the substrate over the first integrated circuit to be adjacent the second face of the integrated circuit.

12. The method of claim 11, wherein the first trace connects to a first pad on the second face of the substrate, and the second trace connects to a second pad on the second face of the substrate, the method further comprising:
    attaching a first face of a second integrated circuit to the second face of the substrate adjacent the second face of the first integrated circuit and electrically connecting the second integrated circuit to the first pad and the second pad on the second face of the substrate.

13. The method of claim 11, further comprising:
    covering the first IC with an encapsulant;
    adhesively connecting the first segment to the encapsulant over a portion of the second face of the first IC; and
    adhesively connecting the second segment to the encapsulant over another portion of the second face of the first IC.

14. The method of claim 11, wherein the first trace connects to a first pad on the second face of the substrate, and the second trace connects to a second pad on the second face of the substrate, the method further comprising:
    covering the first IC with an encapsulant;
    adhesively connecting the first segment to the encapsulant over a portion of the second face of the first IC;
    adhesively connecting the second segment to the encapsulant over another portion of the second face of the first IC; and
    attaching a first face of a second integrated circuit to the second face of the substrate adjacent the second face of the first integrated circuit and electrically connecting the second integrated circuit to the first pad and the second pad on the second face of the substrate.

15. The method of claim 14, wherein the electrically connecting the second integrated circuit to the first pad and the second pad on the second face of the substrate includes using solder ball connections.

16. The method of claim 11, wherein the first trace connects to a first pad on the second face of the substrate, and the second trace connects to a second pad on the second face of the substrate, the method further comprising:

adhesively connecting the first segment to a portion of the second face of the first IC;

adhesively connecting the second segment to another portion of the second face of the first IC; and attaching a first face of a second integrated circuit to the second face of the substrate adjacent the second face of the first integrated circuit and electrically connecting the second integrated circuit to the first pad and the second pad on the second face of the substrate.

17. An apparatus comprising:

a first integrated circuit (IC);

a second IC;

flexible folded substrate means for connecting the first IC to the second IC with shortened signal paths.

18. The apparatus of claim 17, wherein the first IC is surrounded by the substrate means on a first face, a first side and a first portion of a second face of the first IC, and a second side and a second portion of the second face of the first IC.

19. The apparatus of claim 18, wherein the second IC is electrically connected to at least two different segments of the substrate means, the two segments extending around the first side and the second side of the first IC.

20. The apparatus of claim 18, wherein the first IC is also surrounded by the substrate means on a third side and a third portion of a second face of the first IC, and a fourth side and a fourth portion of the second face of the first IC.

* * * * *